(12) United States Patent
Sinev et al.

(10) Patent No.: US 11,516,607 B2
(45) Date of Patent: Nov. 29, 2022

(54) METHOD AND DEVICE FOR CONTROLLING THE DISTORTION OF A LOUDSPEAKER SYSTEM ON BOARD A VEHICLE

(71) Applicant: ARKAMYS, Levallois-Perret (FR)

(72) Inventors: Daniil Sinev, Paris (FR); Guillaume Rossi Ferrari, Colombes (FR); Ivan Bourmeyster, Paris (FR)

(73) Assignee: ARKAMYS

( * ) Notice: Subject to any disclaimer, the term of this patent is extended or adjusted under 35 U.S.C. 154(b) by 0 days.

(21) Appl. No.: 17/283,348

(22) PCT Filed: Oct. 8, 2019

(86) PCT No.: PCT/EP2019/077237
§ 371 (c)(1),
(2) Date: Apr. 7, 2021

(87) PCT Pub. No.: WO2020/074522
PCT Pub. Date: Apr. 16, 2020

(65) Prior Publication Data
US 2022/0007121 A1 Jan. 6, 2022

(30) Foreign Application Priority Data
Oct. 8, 2018 (FR) ...................................... 1859307

(51) Int. Cl.
*H04R 29/00* (2006.01)
*H03G 3/30* (2006.01)

(52) U.S. Cl.
CPC ......... *H04R 29/001* (2013.01); *H03G 3/3005* (2013.01); *H04R 2430/01* (2013.01); *H04R 2499/13* (2013.01)

(58) Field of Classification Search
CPC .. H04R 29/001; H04R 29/00; H04R 2430/01; H04R 2499/13; H04R 3/007; H03G 3/3005; H03G 9/025; H03G 9/18
(Continued)

(56) References Cited

U.S. PATENT DOCUMENTS

| 5,940,518 A | * | 8/1999 | Augustyn | ............ | H04R 29/003 |
| | | | | | 455/226.4 |
| 8,081,776 B2 | * | 12/2011 | Haulick | ................. | H03G 5/165 |
| | | | | | 381/103 |

(Continued)

FOREIGN PATENT DOCUMENTS

WO   2010135294   11/2010

OTHER PUBLICATIONS

International Search Report; International Application No. PCT/EP2019/077237 dated Dec. 20, 2019.

*Primary Examiner* — Xu Mei
(74) *Attorney, Agent, or Firm* — Perman & Green, LLP

(57) ABSTRACT

A method for controlling the distortion generated by a system having at least one loudspeaker on board a vehicle, the loudspeaker being designed to receive an audio signal. The method includes measuring at least one indicator of the distortion of the at least one loudspeaker, determining an acceptable distortion threshold for each distortion indicator, which can be used to determine a maximum acceptable amplitude for each frequency in a frequency range of interest of the audio signal entering the loudspeaker system, generating an assembly comprising at least one filter, correcting the audio signal entering the loudspeaker system by applying at least one filter determined in the generating step.

8 Claims, 6 Drawing Sheets

(58) Field of Classification Search
USPC .............................................. 381/86, 59, 96
See application file for complete search history.

(56) References Cited

U.S. PATENT DOCUMENTS

| | | | |
|---|---|---|---|
| 9,443,502 B2* | 9/2016 | Amadu | H04R 3/00 |
| 2004/0114771 A1* | 6/2004 | Vaughan | H04R 5/02 |
| | | | 381/103 |
| 2005/0276425 A1 | 12/2005 | Forrester et al. | |
| 2013/0142360 A1 | 6/2013 | Potard | |
| 2014/0321668 A1 | 10/2014 | Kimura et al. | |

* cited by examiner

METHOD AND DEVICE FOR CONTROLLING THE DISTORTION OF A LOUDSPEAKER SYSTEM ON BOARD A VEHICLE

CROSS REFERENCE TO RELATED APPLICATIONS

This application is a National Stage of International Application No. PCT/EP2019/077237, having an International Filing Date of 8 Oct. 2019, which designated the United States of America, and which International Application was published under PCT Article 21(2) as WO Publication No. 2020/074522 A1, which claims priority from and the benefit of French Patent Application No. 1859307, filed on 8 Oct. 2018, the disclosures of which are incorporated herein by reference in their entireties.

BACKGROUND

1. Field

The present disclosure relates to a method for controlling the distortion of loudspeakers.

More particularly, the present disclosure relates to the control of distortion of loudspeakers on board a vehicle passenger compartment.

2. Brief Description of Related Developments

In the prior art, methods are known for compensating the phenomenon of distortion of a loudspeaker.

American patent application US2013/0142360, for example, discloses a method for controlling the distortion of a loudspeaker in which the frequency spectrum of the audio signal is attenuated in a frequency band, causing a significant distortion of the signal passing through the loudspeaker.

However, such a method is not suitable for loudspeakers intended to be on board a vehicle. More specifically, the distortion characteristics of such loudspeakers are dependent on the configuration of the vehicle and their mechanical interface with said vehicle.

SUMMARY

The disclosure seeks to remedy the disadvantages of the prior art by proposing a method for controlling the distortion of a loudspeaker system on board a vehicle, for example a car.

The disclosure relates to a method for controlling the distortion generated by a system having at least one loudspeaker on board a vehicle and intended to receive an audio signal. The method according to the disclosure comprises:

a step of measuring at least one indicator of the distortion of the at least one loudspeaker;

a step of determining an acceptable distortion threshold for each distortion indicator, which can be used to determine a maximum acceptable amplitude for each frequency in the frequency range of interest of the audio signal at the input of the loudspeaker system, beyond which maximum amplitude at least one distortion indicator exceeds the distortion threshold associated with it;

a step of generating a set of at least one filter;

a step of correcting the audio signal at the input of the loudspeaker system by applying at least one filter determined in the generation step.

In an aspect of the present disclosure, during the measurement step:

an excitation signal is sent to the loudspeaker system;

a response of said loudspeaker system is captured by means of at least one microphone disposed in the vehicle;

a frequency sweep being carried out on the excitation signal in order to know the response of the loudspeaker system over the frequency range of interest and to determine the at least one distortion indicator of the loudspeaker system over this frequency range of interest.

In an aspect of the present disclosure, the frequency range of interest comprises the frequency range running from 20 Hz to 60 Hz.

In an aspect of the present disclosure, two microphones are used during the measurement step.

In an aspect of the present disclosure, the microphones are placed in the vehicle so that, for each frequency corresponding to an acoustic mode of the car, a position of at least one microphone makes it possible to avoid the nodes of said acoustic mode.

In an aspect of the present disclosure, during the step of determining the acceptable distortion threshold, said threshold is fixed through adjustment by an operator for each distortion indicator taking account of the nature of the audio signal intended to be sent to the loudspeaker system during its use, and/or of the desired rendering and/or of the accepted degree of distortion.

In an aspect of the present disclosure, a filter is determined during the generation step for each volume level of a car radio of the vehicle in order to obtain, for said volume level and for each frequency, an audio signal amplitude less than the maximum acceptable amplitude at this frequency.

In an aspect of the present disclosure, the spectrum of the audio signal is analysed during the generation step in order to determine a filter that can obtain, for each frequency, an audio signal amplitude less than the maximum acceptable amplitude at that frequency, said spectral analysis being carried out at regular intervals, and the filter being consequently adapted.

In an aspect of the present disclosure, the filters are high-pass, low-shelf or peak filters, or originate from any combination of these filter types.

The disclosure also relates to a device for controlling the distortion generated by a system having at least one loudspeaker on board a vehicle and intended to receive an audio signal. According to the disclosure, the device comprises means for carrying out a measurement of at least one distortion indicator of the at least one loudspeaker;

determining an acceptable distortion threshold for each distortion indicator;

determining a maximum acceptable amplitude for each frequency of a frequency range of interest of the audio signal at the input of the loudspeaker system;

generating a set of at least one filter;

correcting the audio signal at the input of the loudspeaker system by applying at least one filter.

BRIEF DESCRIPTION OF THE DRAWINGS

The disclosure will be better understood on reading the description which follows and examining the figures which accompany it. These are given by way of indication only and are in no way limiting on the invention.

DETAILED DESCRIPTION

Figure 1:
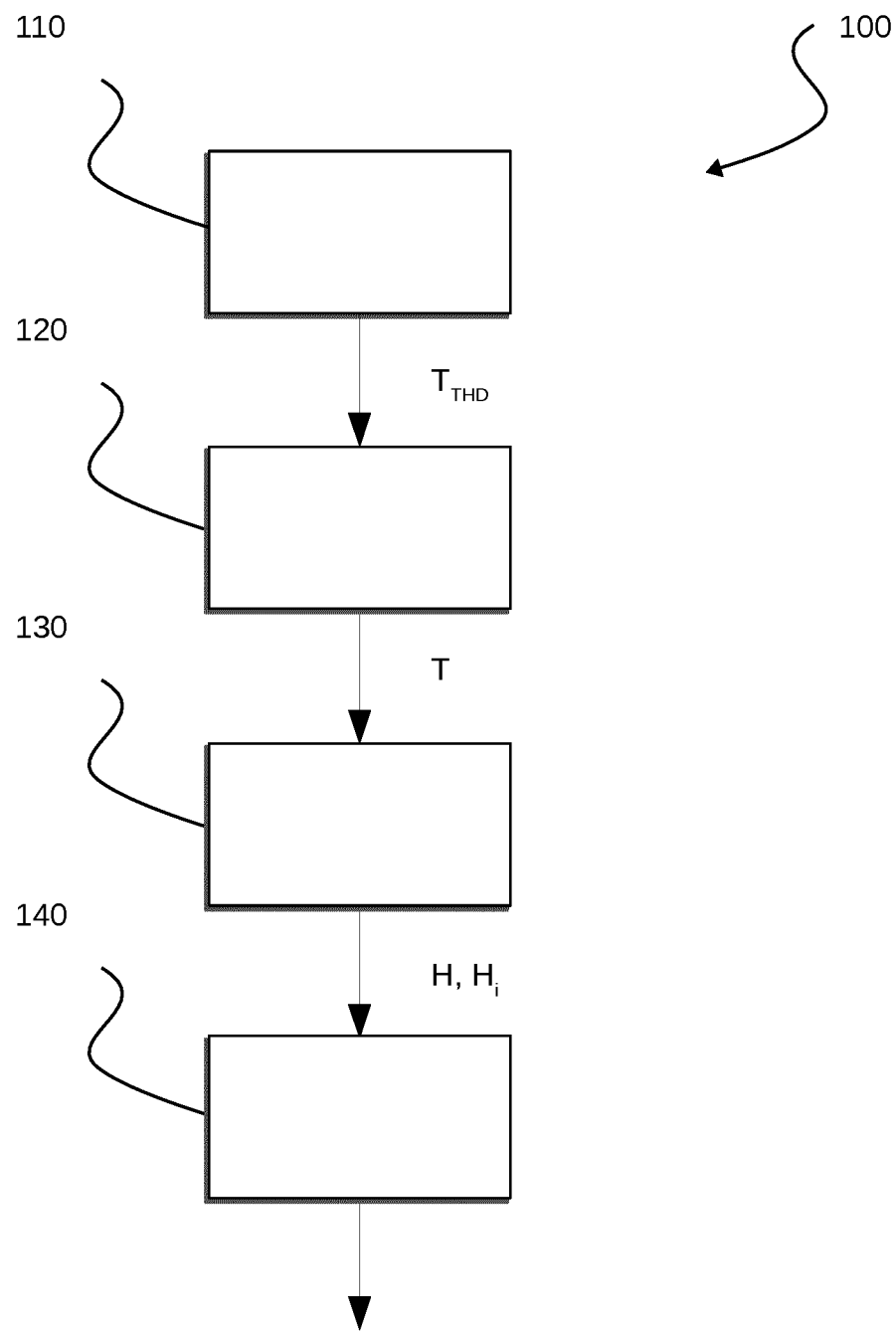
FIG. 1 shows the various steps of the method according to the disclosure.

With reference to FIG. 1, the present disclosure relates to a method 100 for controlling the distortion of a loudspeaker 1 of a vehicle 2, in particular a car.

According to the disclosure, the method 100 comprises:
a step 110 of measuring a non-linear distortion indicator of the loudspeaker;
a step 120 of determining an acceptable distortion threshold;
a step 130 of generating a set of filters;
a step 140 of correcting the signal.

Figure 2:
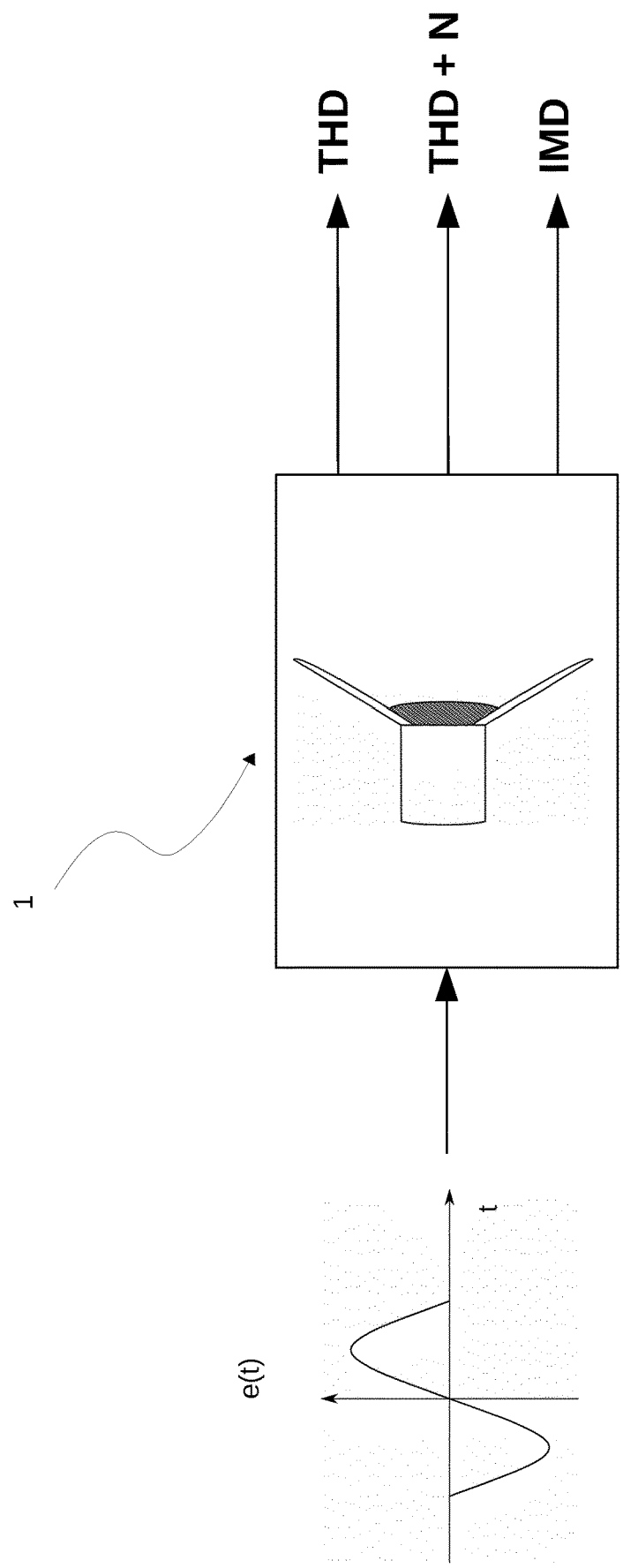
FIG. 2 shows a simplified model of the loudspeaker during the measurement step, during which a sinusoidal excitation signal is sent to the input of the loudspeaker and a set of distortion indicators are measured.

With reference to FIG. 2, during the measurement step 110, a non-linear distortion indicator of the loudspeaker is measured. The non-linear distortion indicator may, for example, be a level $T_{THD}$ of total harmonic distortion THD, a level $T_{THD+N}$ of total harmonic distortion plus noise THD+N, or a level $T_{IMD}$ of inter-modulation distortion IMD. In what follows of the description, the level $T_{THD}$ of total harmonic distortion THD is considered; however, the disclosure can of course be adapted to total harmonic distortion plus noise THD+N indicators, intermodulation distortion IMD indicators, a combination of these indicators, or even other distortion indicators not mentioned here.

The measurement of the level $T_{THD}$ of total harmonic distortion THD is carried out by exciting the loudspeaker 1 by a sinusoidal input signal e(t) of frequency $f_0$, called the fundamental frequency, and amplitude A. The term "input signal" shall mean the electrical signal entering the loudspeaker. In the context of the measurement step 110, the input signal is called the "excitation signal". The excitation of the loudspeaker 1 by the excitation signal e(t) generates an acoustic wave in a passenger compartment of the vehicle 2, which is closed. A microphone M1 placed in said passenger compartment captures said acoustic wave and generates an output signal s(t). The output signal s(t) is the electrical signal generated by the microphone M1 in response to the capture of the acoustic wave in the passenger compartment, and takes account therefore of the acoustic phenomena relating to the environment of the loudspeaker and the microphone, for example propagation in the air and reverberation.

Due to the non-linearities of the loudspeaker 1, it generates harmonics corresponding to integer-multiple frequencies of the fundamental frequency $f_0$.

The level $T_{THD}$ of total harmonic distortion THD is then measured using the relationship:

$$T_{THD} = 100 \times \frac{\sqrt{\sum_{n=2}^{M} V_{e,n}^2}}{V_{e,1}^2}$$

where:
$V_{e,n}$ designates the effective value of the harmonic rank n, the harmonic of rank 1 corresponding to the fundamental frequency $f_0$;
M designates the highest harmonic rank considered in the calculation of the level $T_{THD}$ of total harmonic distortion. The value of M may, for example, take into account the fact that the effects of the distortion are no longer perceptible by an individual above 20 kHz. Hence, M may for example be such that $M \times f_0 \leq 20,000$ and $(M+1) \times f_0 > 20,000$.

The level $T_{THD}$ of total harmonic distortion is expressed in percentage.

The level $T_{THD}$ of total harmonic distortion is calculated over a range of frequencies f of interest [fmin; fmax] comprised between a minimum frequency fmin and a maximum frequency fmax, by varying the fundamental frequency $f_0$ of the excitation signal e(t), by continuous or discrete sweeping of the frequency over this frequency range of interest.

The non-linearities of the loudspeaker appear in particular at low frequencies, in general for frequencies less than 150 Hz, these non-linearities being more or less marked depending on the loudspeaker considered. In a preferred aspect of the present disclosure, the frequency range of interest [fmin; fmax] considered comprises the range of frequencies from 20 Hz to 60 Hz, which corresponds to a frequency range for which the non-linearities are particularly significant, whatever the loudspeaker considered.

The level $T_{THD}$ of total harmonic distortion is determined over the frequency range of interest for a range of amplitudes A of the excitation signal between a first amplitude and a second amplitude, for example between −40 dB and 0 dB.

Figure 3:
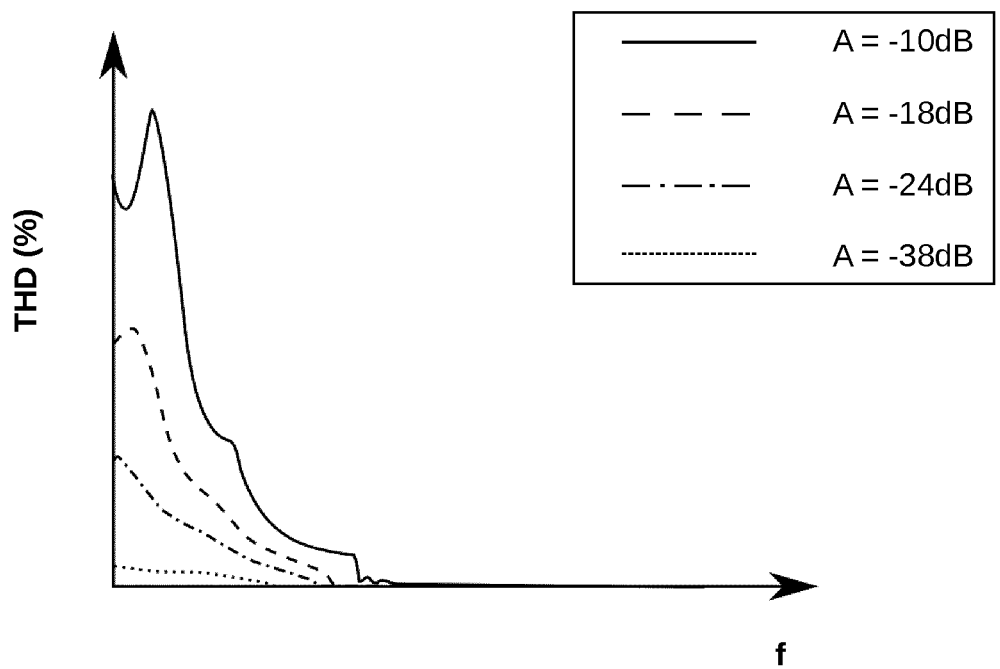
FIG. 3 shows four curves of the level of total harmonic distortion for four different amplitudes of the excitation signal.

FIG. 3 shows four examples of curves illustrating a profile of the level $T_{THD}$ of total harmonic distortion depending on the frequency f, obtained at the end of the measurement step 110.

The solid curve corresponds to an amplitude A of the input signal e(t) equal to −10 dB.

The dashed curve corresponds to an amplitude A of the input signal e(t) equal to −18 dB.

The dot-dash curve corresponds to an amplitude A of the input signal e(t) equal to −24 dB.

The dotted curve corresponds to an amplitude A of the input signal e(t) equal to −38 dB.

The measurement step 110 is carried out in situ, in the passenger compartment of the closed vehicle, which makes it possible to take into account the characteristics of the passenger compartment, in particular its dimensions or the acoustic properties of objects disposed therein (seats, gear stick, etc.), or even the mechanical interactions between the loudspeaker 1 and its environment. In practice, the frequency sweep can lead, for certain particular frequencies, to an excitation of eigenmodes of the vehicle 2, leading to an appearance of stationary waves and substantially large differences in amplitude of the pressure waves in the volume of the passenger compartment for these frequencies, from one point in space to another. In particular, for these frequencies, antinodes and nodes appear, corresponding to regions of space where a pressure amplitude attains a local maximum and minimum respectively. Consequently, the microphone M1 placed at a node at the point where the variations in pressure of the acoustic wave are very small, in other words imperceptible during a measurement because they are masked by the measurement noise and/or an ambient noise, does not allow a reliable measurement of the level $T_{THD}$ of total harmonic distortion to be carried out.

Consequently, it is preferable to use a number of microphones greater than or equal to two. A configuration of microphones in the passenger compartment is such that if one of the microphones is located at a node for a given excitation of the loudspeaker 1, then another microphone will be outside of the nodes and the signal captured by this other microphone can be used for determining of the level $T_{THD}$ of the total harmonic distortion.

Figure 4A:
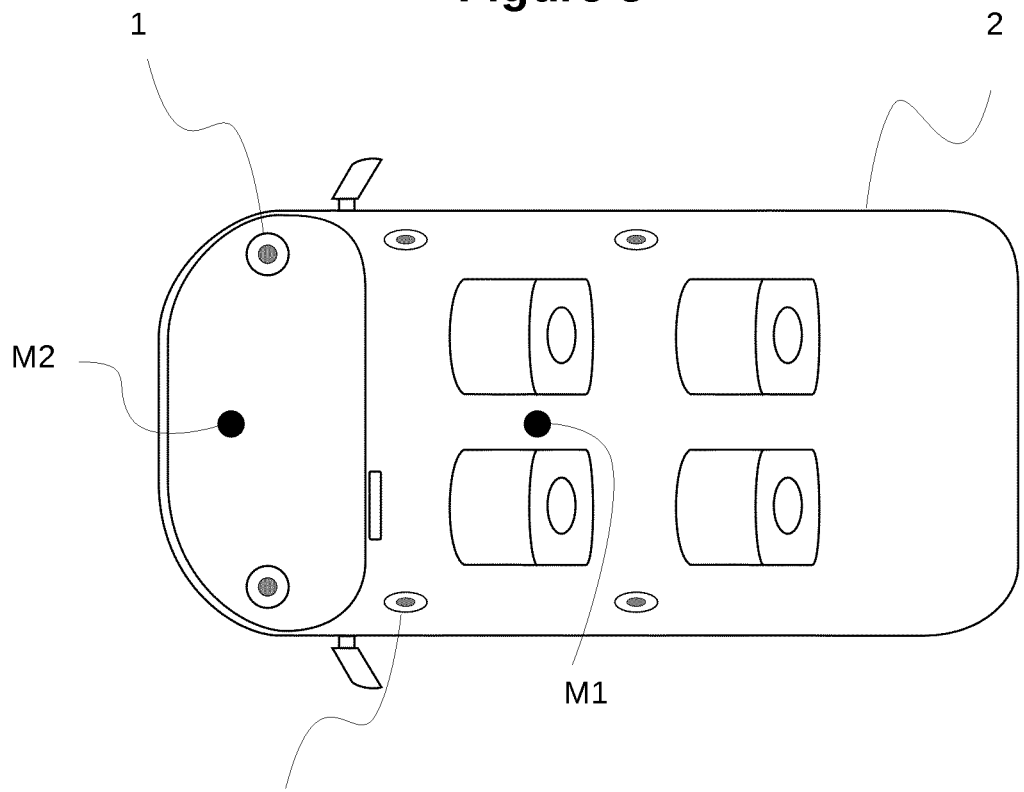
FIG. 4A shows a configuration of microphones during the measurement step in an aspect of the present disclosure.
Figure 4B:
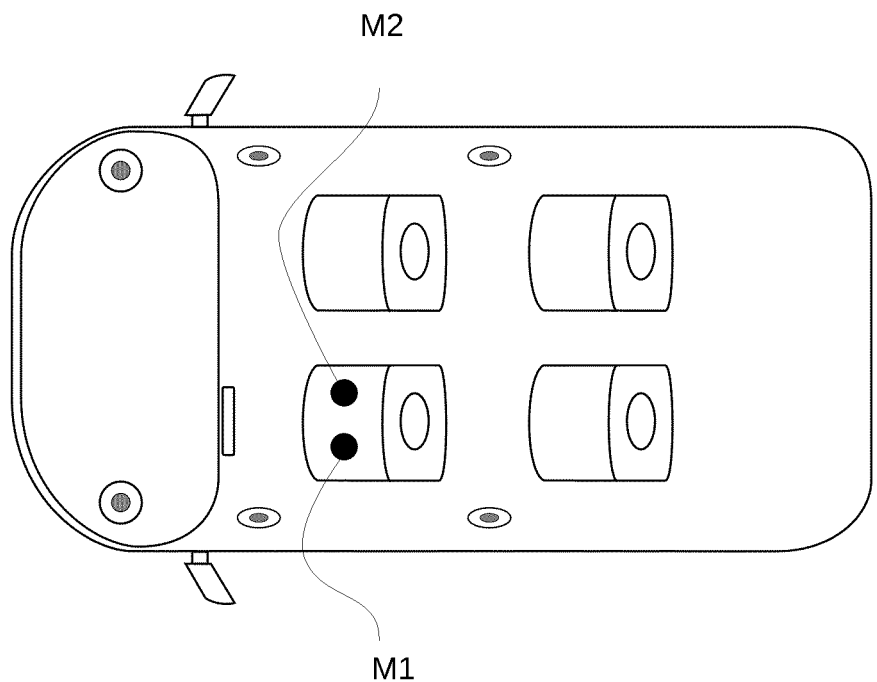
FIG. 4B shows a configuration of microphones during the measurement step in an alternative aspect of the present disclosure.
Figure 4C:
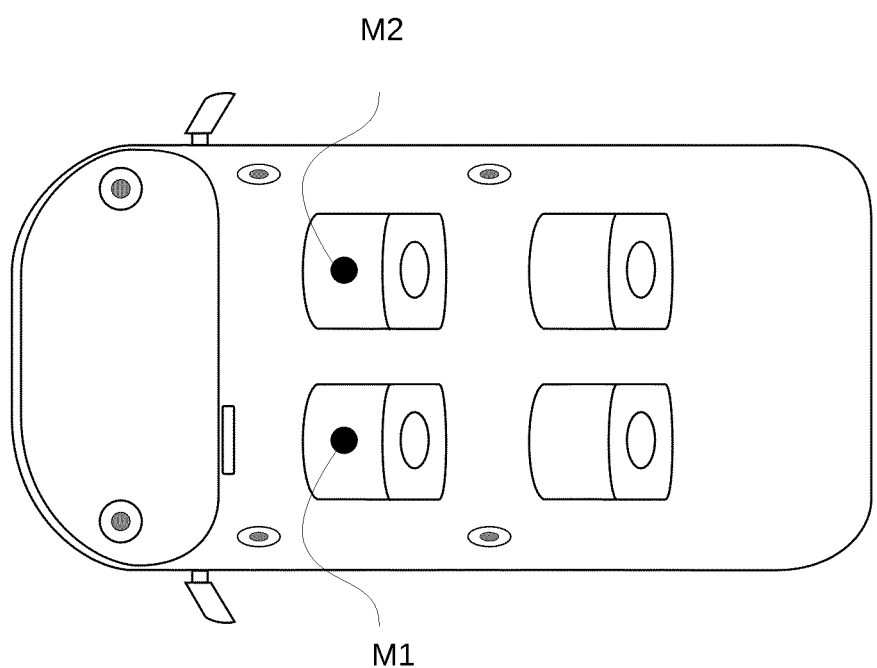
FIG. 4C shows a configuration of microphones during the measurement step in an alternative aspect of the present disclosure.

FIGS. 4A, 4B and 4C illustrate three possible configurations for a set of two microphones M1, M2 disposed in the passenger compartment of the vehicle 2. These three configurations make it possible to determine the level $T_{THD}$ of total harmonic distortion at least over one range of frequencies of interest, running from 20 Hz to 1 kHz.

In the configuration of FIG. 4A, a first microphone M1 is disposed between the front, driver and passenger seats of the car. A second microphone M2 is disposed between the dashboard of the vehicle and the front windscreen.

In the configuration of FIG. 4B, the first microphone M1 and the second microphone M2 are disposed on the seating portion of the driver's seat.

In the configuration of FIG. 4C, the first microphone M1 is disposed on the seating portion of the driver's seat while the second microphone M2 is disposed on the seating portion of the front passenger seat.

Of course, other configurations can be envisaged and other microphones can be used.

During the determination step 120, an acceptable distortion threshold T is fixed. The acceptable distortion threshold corresponds to a minimum value of the non-linear distortion indicator, in this case the level of total harmonic distortion, above which the correction of the distortion is applied according to the method 100 of the invention, and below which no correction is applied. If the indicator is equal to the acceptable distortion threshold, it can be chosen to carry out a correction or not, according to the circumstances.

The determination of the acceptable distortion threshold is arbitrary, but depends to a large degree on the nature of the signal intended to be sent to the loudspeaker 1 during its use, as well as on the desired rendering. Indeed, as will be understood from the following, the correction of distortion according to the disclosure attenuates a part of the frequency spectrum of the input signal e(t), consequently, the lower the distortion threshold T, the less faithful the rendering at the loudspeaker output is after processing the signal for high volume levels. The volume level set by means of a car radio transmitting the audio signals to the loudspeaker is called the "volume level". Hence, the lower the distortion threshold, the less it is possible to increase the overall volume of the audio signal without denaturing it. Thus for a given volume level and an acceptable distortion threshold, an electro type music having a significant frequency spectrum at low frequencies will be more rapidly denatured by the processing carried out by the method 100 in the event of an increase in volume, than classical type music having a poorer frequency spectrum at low frequencies. The threshold should therefore be adjusted depending on the maximum desired level at the loudspeaker output and depending on the tolerated degree of distortion.

Figure 5A:
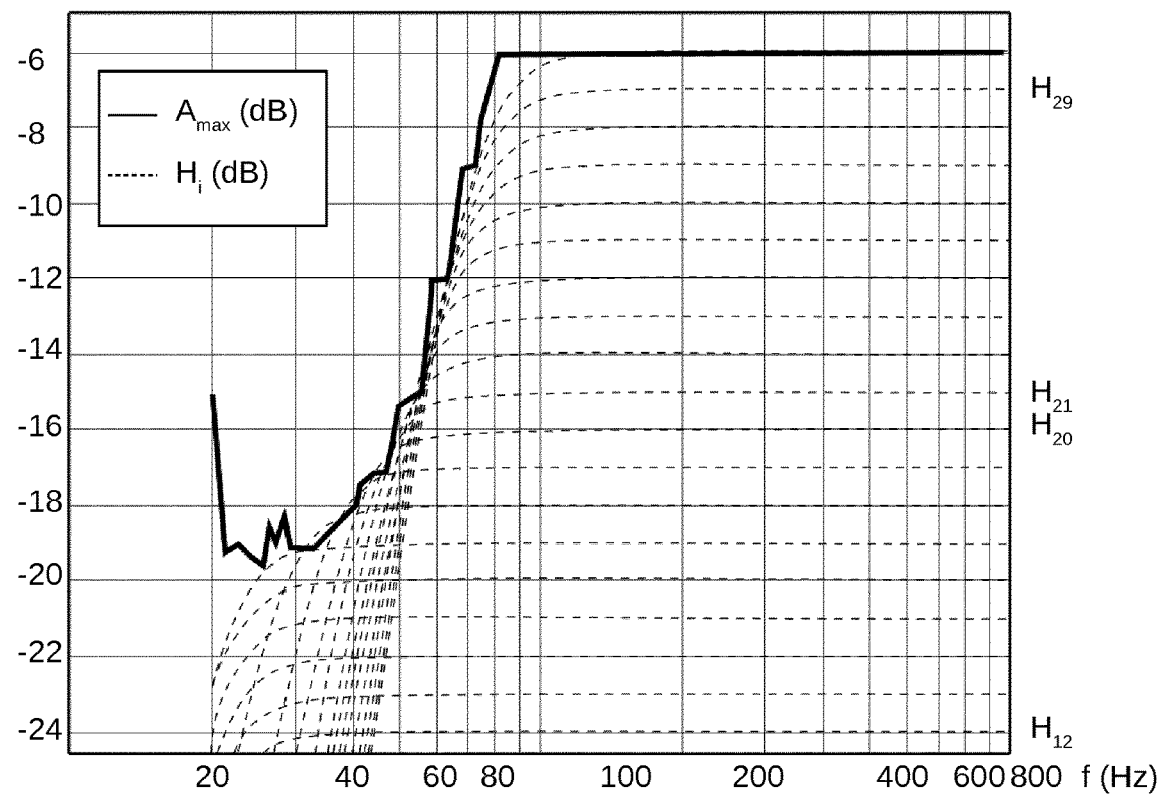
FIG. 5A shows, on the one hand, a maximum acceptable amplitude depending on the frequency at the input of the loudspeaker and, on the other hand, a set of high-pass filters to be applied to the input signal depending on the volume level of the car radio of the vehicle.
Figure 5B:
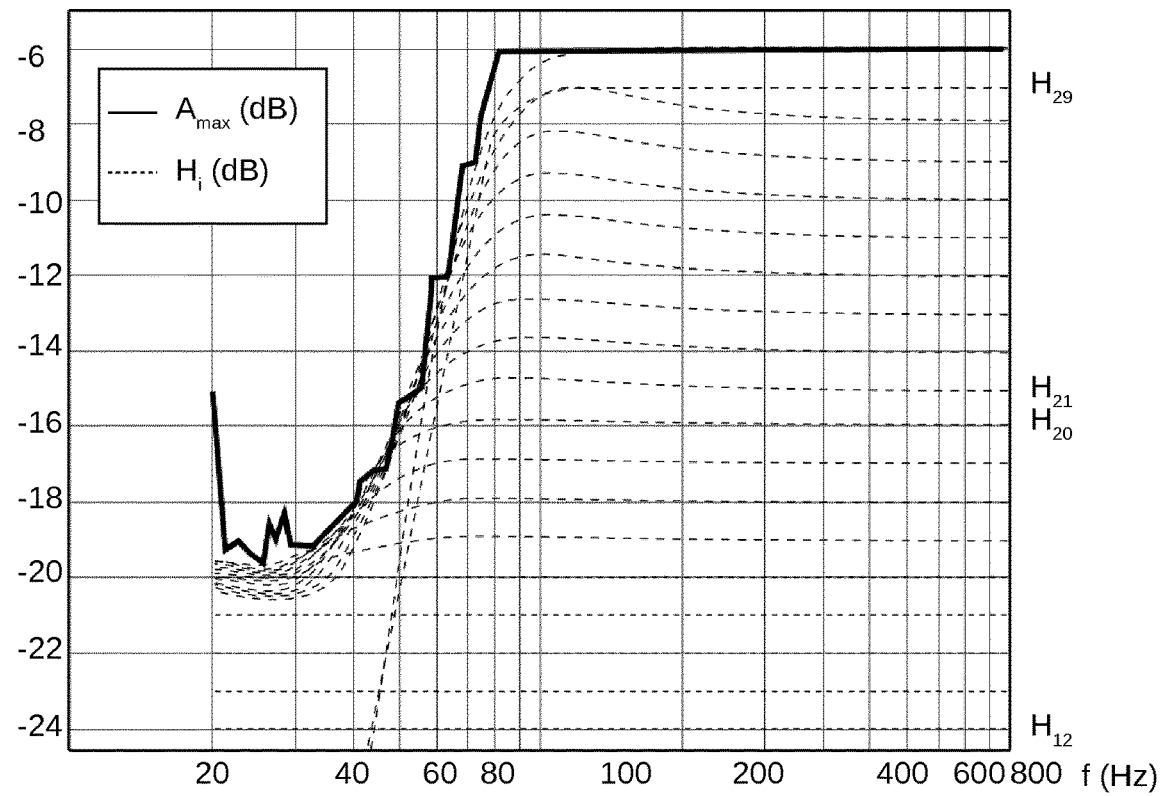
FIG. 5B shows, on the one hand, a maximum acceptable amplitude depending on the frequency at the input of the loudspeaker and, on the other hand, a set of low-shelf filters to apply to the input signal depending on the volume level of the car radio of the vehicle.

In each of FIGS. 5A and 5B, the solid curve illustrates a maximum acceptable amplitude Amax of the input signal e(t) of the loudspeaker 1 depending on the frequency, in other words beyond which a level of total harmonic distortion is obtained which is greater than the threshold value fixed during the determination step 120 of the acceptable distortion threshold.

By way of example, for the case illustrated in FIGS. 5A and 5B, a sound level of −12 dB at 50 Hz leads to a value of the level $T_{THD}$ of total harmonic distortion equal to the threshold value T at the same frequency.

During the generation step 130, at least one filter intended to be applied to the input signal e(t) before its passage into the loudspeaker is determined. The input signal considered here and in the course of the following step is called "audio signal", and can in general be any type of sound signal, in particular of the musical type coming, for example, from a CD-ROM or a USB flash drive.

Figure 6A:
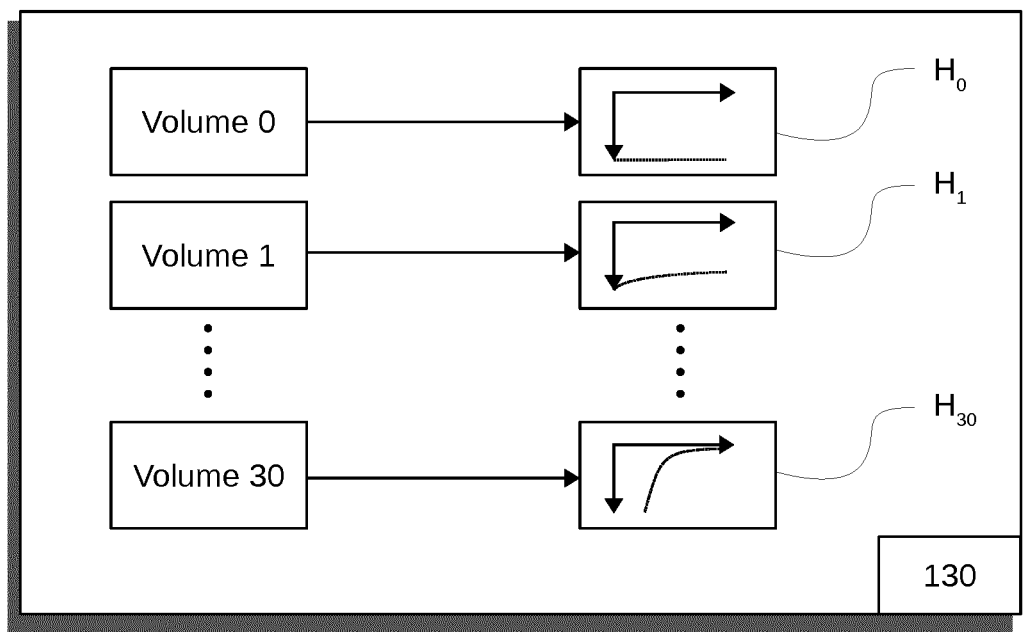
FIG. 6A shows the step of generating filters in a first aspect of the present disclosure.

In a first aspect of the present disclosure illustrated in FIG. 6A, a filter Hi is determined for each volume level i of the car radio, said volume level i changing, for example, on a scale running from 0 to 30 inclusive. The generated filters Hi make it possible, for a given volume level of the car radio, to obtain for each frequency an amplitude of the audio signal less than the maximum acceptable amplitude Amax.

Since the distortion is more marked at low frequencies, the filters selected advantageously allow the low frequencies to be attenuated and are, for example, high-pass, low-shelf or peak filters, or come from a combination of these three types of filters. In FIGS. 5A and 5B, the generated filters Hi are represented by dashed lines and are respectively high-pass filters of order four and low-shelf filters with a quality factor of 1.8.

Preferably, several types of input signals are considered in order to generate these filters, for example music of the classical, electro, rock, pop, hip-hop and jazz types etc., and for each type of music and each volume level of the car radio, the filter enabling the maximum amplitude Amax to not be exceeded is determined. The filter ultimately selected for a given volume level originates from a combination of filters determined for each type of music, enabling, for each frequency and each type of music, the maximum amplitude Amax at the loudspeaker input to not be exceeded.

In this first aspect of the present disclosure, the set of speakers is therefore generated before the car radio is used by a user.

The audio signal is then corrected during the correction step 140 when the user uses the car radio.

The filter Hi corresponding to the volume level i set by the user is applied to the audio signal, upstream of the loudspeaker. The filtered signal, or corrected audio signal, is sent to the loudspeaker.

In this first aspect of the present disclosure, the filter is said to be "static" and does not vary until the user changes the volume of the car radio.

Figure 6B:
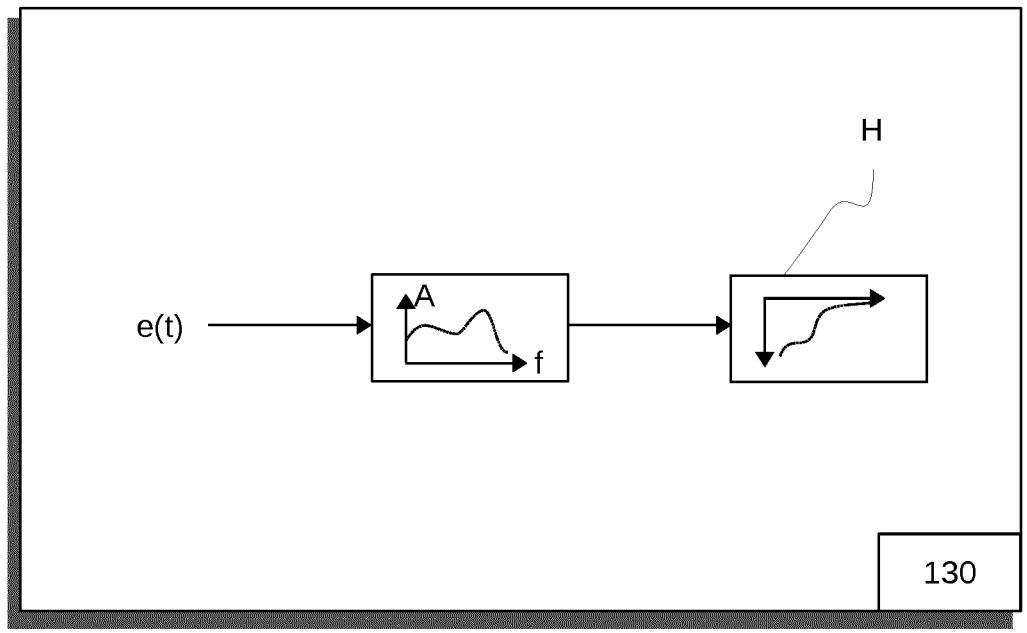
FIG. 6B represents the step of generating filters in a second aspect of the present disclosure.

In a second aspect of the present disclosure illustrated in FIG. 6B, a spectral analysis of the audio signal is carried out in real time, during the generation step 130, during the use of the car radio by the user. A filter H is generated based on the result of this analysis. The filter is determined such that it makes it possible, for each frequency, to obtain an amplitude A of the audio signal e(t) at the output of the filter that is less than the maximum acceptable amplitude Amax.

By way of example, denoting the acceptable distortion threshold at a particular frequency f1 as T(f1), if the amplitude A(f1) of the input signal is equal to T(f1)+3dB, then the value of the filter H(f1) at f1 must be less than or equal to −3 dB.

The audio signal is then corrected during the correction step 140. The filter H is applied to the signal before its input to the loudspeaker. The filtered signal, or corrected audio signal, is sent to the loudspeaker.

In this aspect of the present disclosure, the filter H can thus be updated at regular time intervals, for example every twenty milliseconds. This filter is said to be "dynamic" and changes in real time to adapt to the signal.

An advantage of this aspect of the present disclosure is that it takes into account variations over time in the frequency spectrum of the audio signal sent to the loudspeaker 1.

An advantage of the first aspect of the present disclosure is that it requires less resources than the second aspect of the present disclosure and it is less complex, insofar as it is sufficient to apply a predetermined filter depending on the volume level of the car radio.

Although a single loudspeaker has been considered, the disclosure can also be applied to a system with a plurality of loudspeakers. In that case, generating and applying the filter should be considered for each frequency for the loudspeaker generating the most distortion. The maximum acceptable amplitude Amax depends, at a given frequency, on the dimensioning loudspeaker, in other words the one generating the most distortion at this frequency, the dimensioning loudspeaker being able to be different from one frequency to another.

Likewise, the disclosure can be applied mutatis mutandis to another non-linear distortion indicator, for example the level $T_{THD+N}$ of total harmonic distortion plus noise THD+N, or again the level $T_{IMD}$ of intermodulation distortion IMD. It is also possible to consider these indicators in parallel and to fix a distortion threshold for each non-linear distortion indicator. The set of filters must be established in such a way as not to exceed, for each frequency, the minimum value threshold.

What is claimed is:

1. A method for controlling the distortion generated by a system having at least one loudspeaker on board a vehicle and designed to receive an audio signal, characterised in that it comprises:
a step of measuring at least one distortion indicator of the at least one loudspeaker, during which measurement step an excitation signal is sent to the system of loudspeakers, a response of said loudspeaker system is captured by means of at least one microphone disposed in the vehicle, a frequency sweep being carried out on the excitation signal in order to know the response of the loudspeaker system over a frequency range of interest and to determine the at least one distortion indicator of the loudspeaker system over this frequency range of interest, the at least one microphone being disposed in the vehicle such that, for each frequency corresponding to an acoustic mode of the car, a position of at least one microphone makes it possible to avoid the nodes of said acoustic mode;

a step of determining an acceptable distortion threshold for each distortion indicator, which can be used to determine a maximum acceptable amplitude for each frequency in the frequency range of interest of the audio signal at the input of the loudspeaker system, beyond which maximum amplitude at least one distortion indicator exceeds the distortion threshold associated with it;

a step of generating a set of at least one filter intended to be applied to the audio signal, for obtaining, for each frequency of the range of frequencies of interest of said audio signal, an audio signal amplitude less than the maximum acceptable amplitude;

a step of correcting the audio signal at the input of the loudspeaker system by applying at least one filter determined during the step of generating the audio signal.

2. The method according to claim 1, characterised in that the range of frequencies of interest comprises the frequency range running from 20 Hz to 60 Hz.

3. The method according to claim 1, characterised in that two microphones are used during the measurement step.

4. The method according to claim 1, characterised in that during the step of determining the acceptable distortion threshold, said threshold is fixed through adjustment by an operator for each distortion indicator taking account of the nature of the audio signal intended to be sent to the loudspeaker system during its use, and/or of the desired rendering and/or of the accepted degree of distortion.

5. The method according to claim 1, characterised in that a filter is determined during the generation step for each volume level of a vehicle car radio.

6. The method according to claim 1, characterised in that a spectral analysis of the audio signal is carried out during the generation step in order to determine a filter, said spectrum analysis being carried out at regular intervals, and the filter being consequently adapted.

7. The method according to claim 1, characterised in that the filters are high-pass, low-shelf or peak filters, or originate from a combination of any of these filter types.

8. A device for controlling the distortion generated by a system having at least one loudspeaker on board a vehicle and designed to receive an audio signal, characterised in that it comprises means for:
measuring at least one distortion indicator of the at least one loudspeaker, during which measurement step an excitation signal is sent to the system of loudspeakers, a response of said loudspeaker system is captured by means of at least one microphone disposed in the vehicle, a frequency sweep being carried out on the excitation signal in order to know the response of the loudspeaker system over a frequency range of interest and to determine the at least one distortion indicator of the loudspeaker system over this frequency range of interest, the at least one microphone being disposed in the vehicle such that, for each frequency corresponding to an acoustic mode of the car, a position of at least one microphone makes it possible to avoid the nodes of said acoustic mode;

determining an acceptable distortion threshold for each distortion indicator, which can be used to determine a maximum acceptable amplitude for each frequency in the frequency range of interest of the audio signal at the input of the loudspeaker system, beyond which maximum amplitude at least one distortion indicator exceeds the distortion threshold associated with it;

generating a set of at least one filter intended to be applied to the audio signal, for obtaining, for each frequency of the range of frequencies of interest of said audio signal, an audio signal amplitude less than the maximum acceptable amplitude;
correcting the audio signal at the input of the loudspeaker system by applying at least one filter determined during the step of generating the audio signal.

* * * * *